WITNESSES
Edwin E. Brasher
John E. Healy, Jr.

INVENTORS
William A. Fish, Jr., James M. Telford
and Hayes O. Dakin, Jr.
BY
Willard R. Crout
ATTORNEY Oct. 26, 1965 J. M. TELFORD ETAL 3,214,547

INTERRUPTING STRUCTURE AND GAS-CONTROL ARRANGEMENT FOR COMPRESSED-GAS CIRCUIT INTERRUPTER

Filed Jan. 17, 1962 10 Sheets-Sheet 2

Oct. 26, 1965 J. M. TELFORD ETAL 3,214,547

INTERRUPTING STRUCTURE AND GAS-CONTROL ARRANGEMENT FOR COMPRESSED-GAS CIRCUIT INTERRUPTER

Filed Jan. 17, 1962

Oct. 26, 1965 J. M. TELFORD ETAL 3,214,547

INTERRUPTING STRUCTURE AND GAS-CONTROL ARRANGEMENT FOR COMPRESSED-GAS CIRCUIT INTERRUPTER

Filed Jan. 17, 1962 10 Sheets-Sheet 7

OPEN
POSITION

Oct. 26, 1965 J. M. TELFORD ETAL 3,214,547

INTERRUPTING STRUCTURE AND GAS-CONTROL ARRANGEMENT FOR COMPRESSED-GAS CIRCUIT INTERRUPTER

Filed Jan. 17, 1962

10 Sheets-Sheet 9

3,214,547

INTERRUPTING STRUCTURE AND GAS-CONTROL ARRANGEMENT FOR COMPRESSED-GAS CIRCUIT INTERRUPTER

James M. Telford, Penn Hills, William A. Fish, Jr., Wilkins Township, Allegheny County, and Hayes O. Dakin, Jr., North Huntingdon Township, Westmoreland County, Pa., assignors to Westinghouse Electric Corporation, East Pittsburgh, Pa., a corporation of Pennsylvania Filed Jan. 17, 1962, Ser. No. 166,784
13 Claims. (Cl. 200—148)

This invention relates to compressed-gas circuit interrupters in general, and, more particularly, to improved compressed-gas interrupting structures with improved electrical and pneumatic control therefor.

A general object of the present invention is to provide an improved compressed-gas circuit interrupter of compact dimensions and utilizing a simplified control therefor.

Another object of the present invention is to provide an improved compressed-gas circuit interrupter of the pressurized-tank type in which improved arc-extinguishing units are utilized for quickly interrupting the connected circuit through the interrupter.

Still a further object of the present invention is to provide an improved simplified control arrangement suitable for simultaneously and accurately controlling a number of circuit-interrupting units, the latter being positioned within an enclosing pressurized tank.

Still a further object of the present invention is to provide an improved disconnecting-switch structure operated in timed relation to the interrupting units to afford an isolating break within the circuit interrupter, and thereby permit reclosure of the arcing contact structures.

In particular, the improved disconnecting switch structure, or isolator structure of the present invention includes a generally rod-shaped movable disconnecting contact, piston actuated within an operating cylinder, in which the opening side of the operating piston is constantly subjected to relatively low pressure. The other, or closing side of the operator piston for the rod-shaped movable isolator contact is alternated in pressure from high, or tank pressure, to relatively low or atmospheric pressure by suitable valve control. Preferably, such valve control comprises a three-way isolator control valve interposed between the isolator assembly and a pneumatic control unit, which controls the pilot pressure line to the three-way isolator control valve.

Another object of the invention is to provide an improved arcing contact construction for a compressed-gas circuit interrupter, whereby apertures are provided in the contact head to utilize pressure differential to maintain the contact in the closed position until forcibly picked up by the operating piston during opening.

In United States patent application filed October 3, 1960, Serial No. 59,882 by Jack E. Schrameck and Hayes O. Dakin, Jr., entitled "Compressed-Gas Circuit Interrupters," and assigned to the assignee of the instant application, there is disclosed and claimed a novel type of compressed-gas circuit interrupter utilizing a pressurized-tank construction, in which is a simplified and pneumatic control arrangement is employed to effect operation of the serially-related arc-extinguishing units disposed within the pressurized-tank structure. It is, accordingly, a further object of the present invention to improve, and render more simplified, the pneumatic operating arrangement of the aforesaid patent application rendering it more suitable for accurate timing adjustment and effecting overall improvements in the breaker performance.

Further objects and advantages will readily become apparent upon reading the following specification, taken in conjunction with the drawings, in which.

Figure 1:
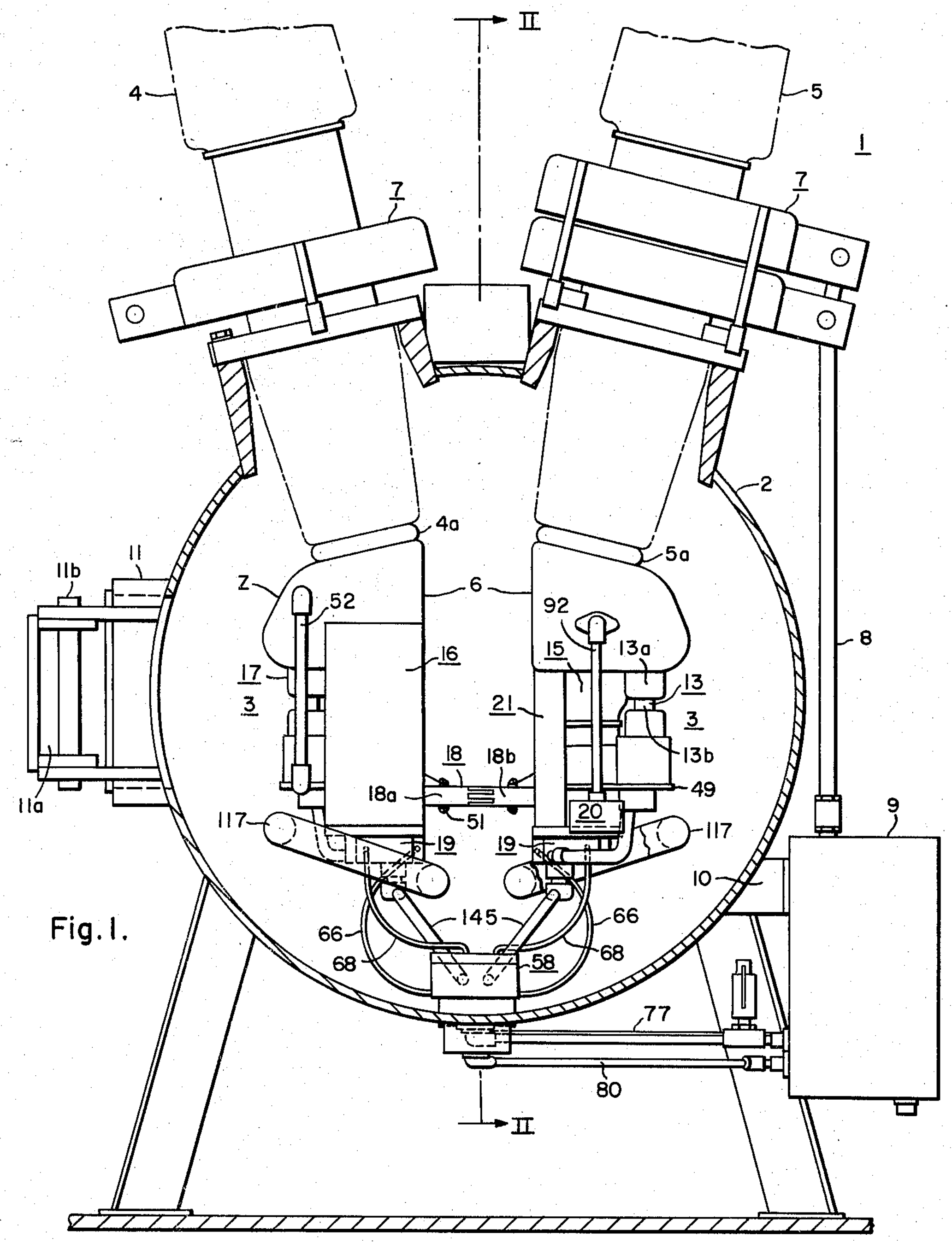
FIGURE 1 is a vertical sectional view taken substantially along the line I—I of FIG. 2 and illustrating an embodiment of the present invention, the contact structure being illustrated in the closed-circuit position.
Figure 2:
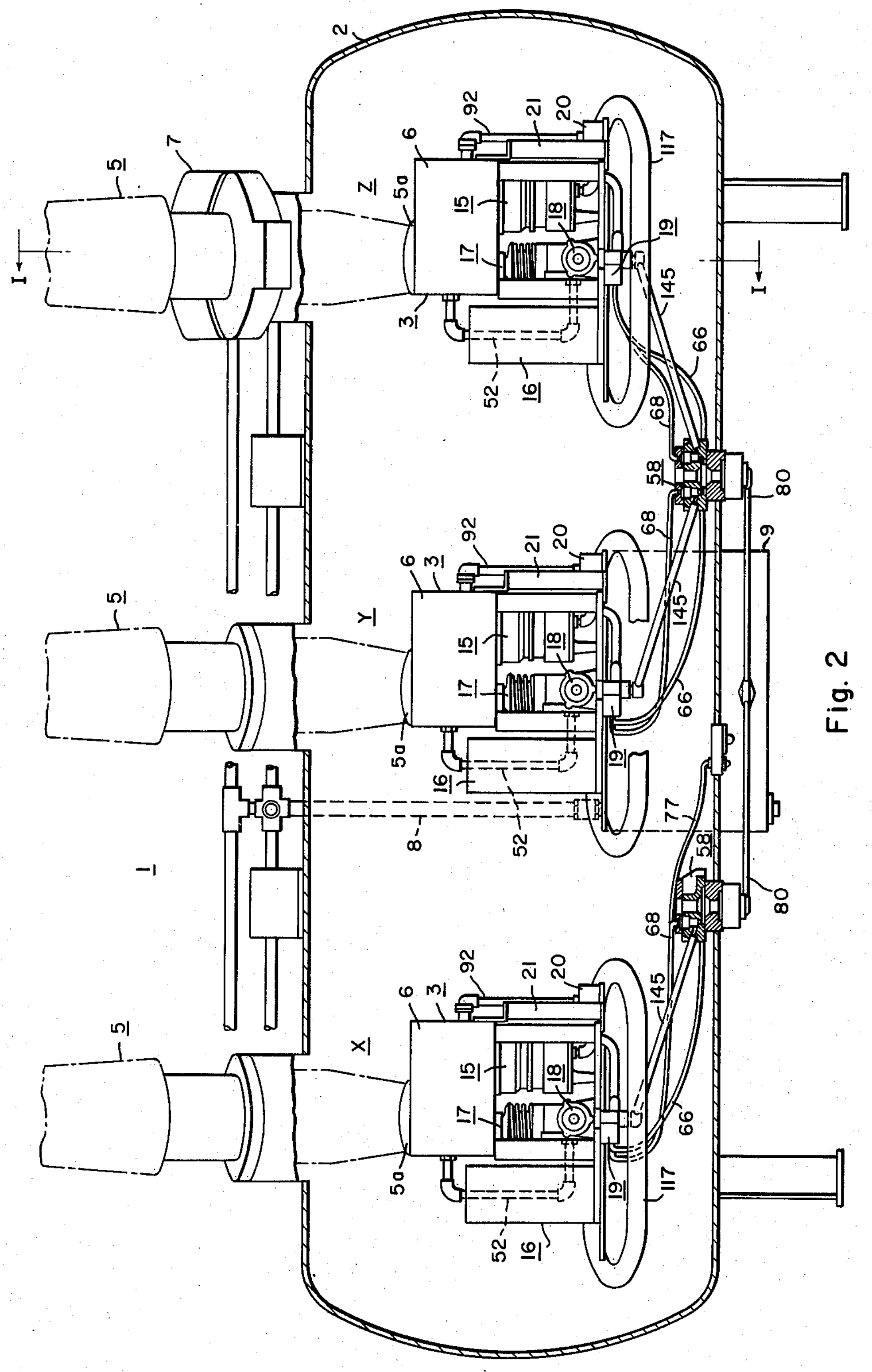
FIG. 2 is a longitudinal vertical section view taken substantially along the line II—II of FIG. 1, again the contact structure being illustrated in the closed-circuit position.
Figures 3A, 15:
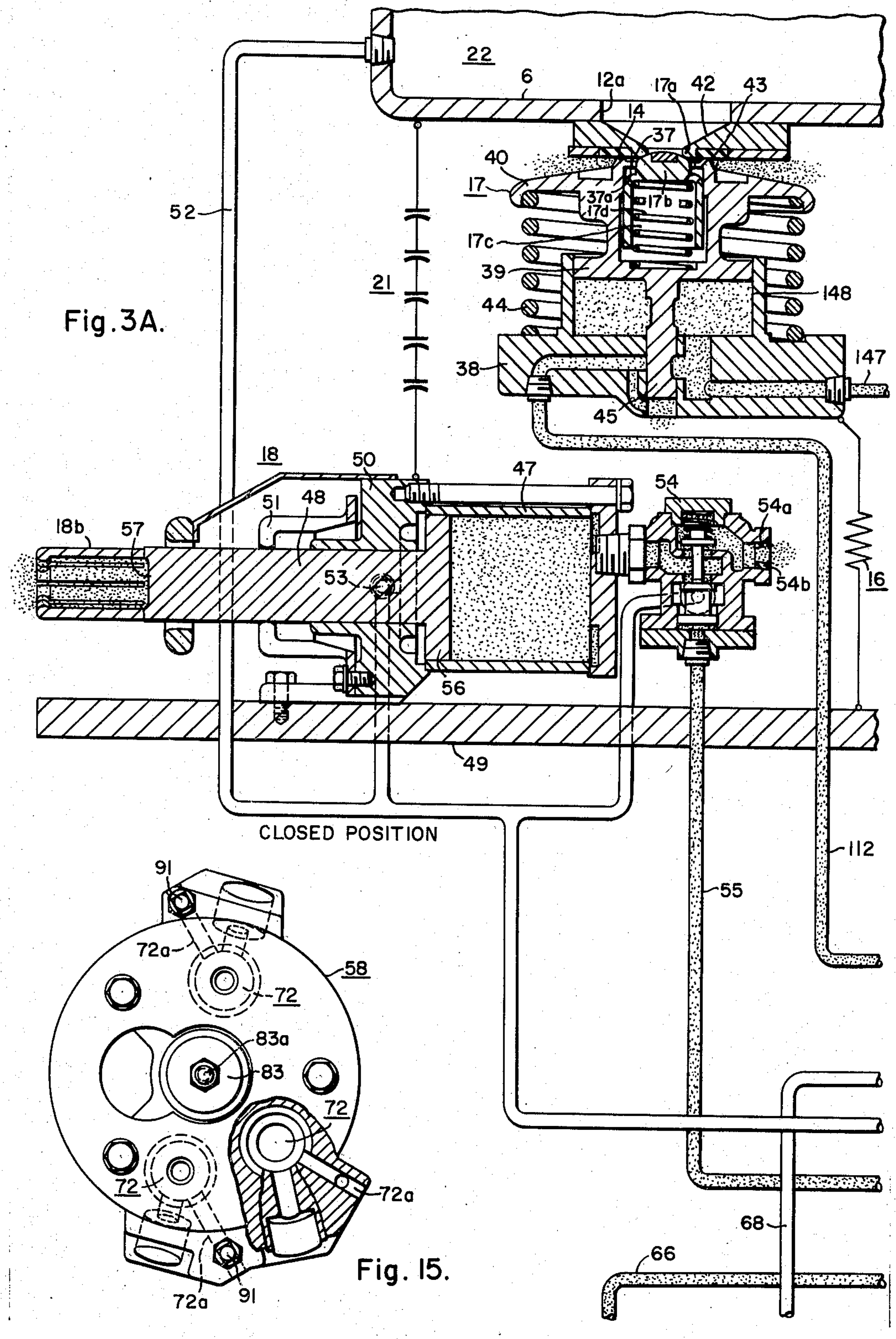
Figure 3B:
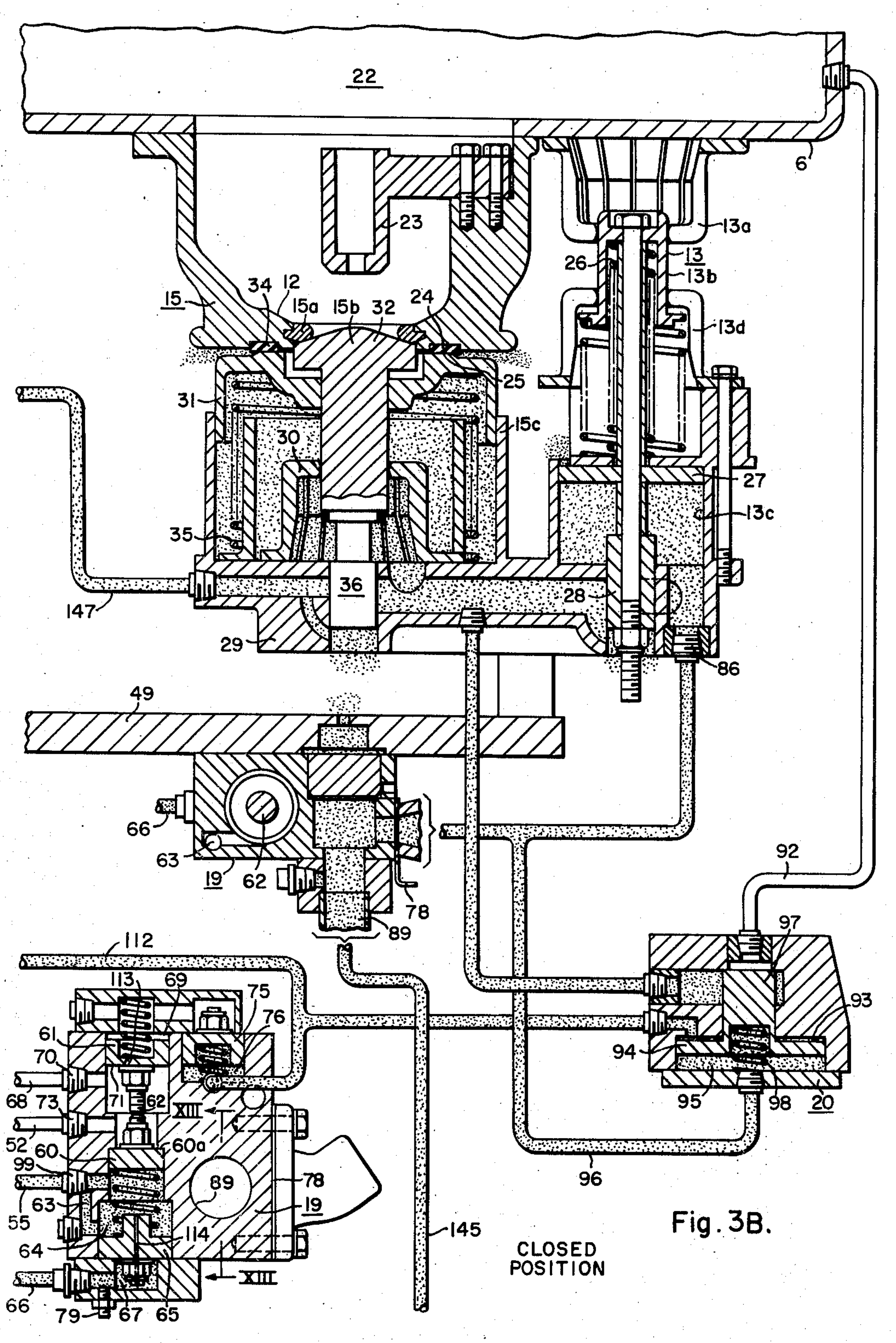
Figure 3C:
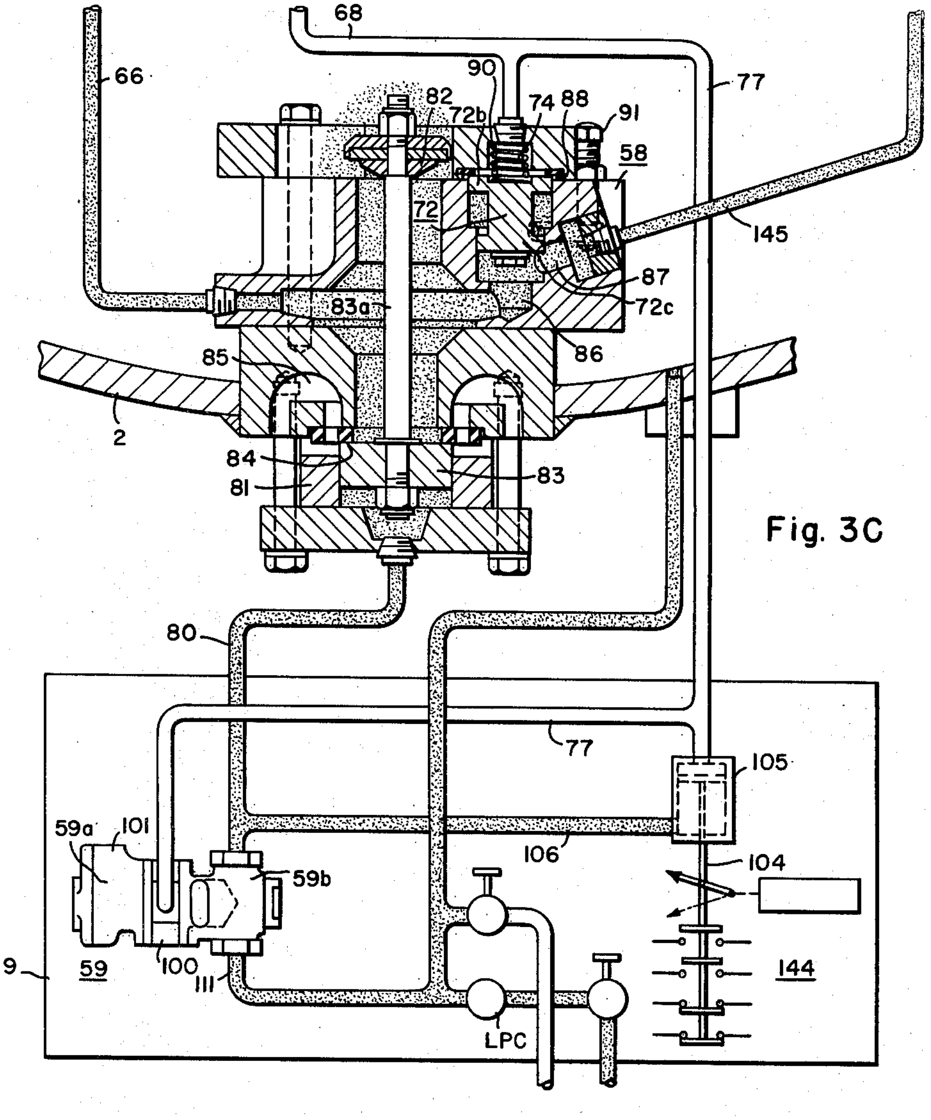
Figure 4:
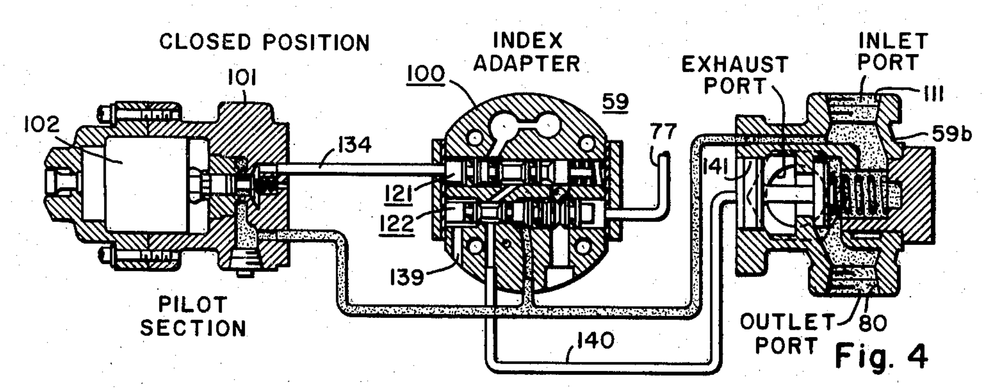
Figures 5A, 13, 14:
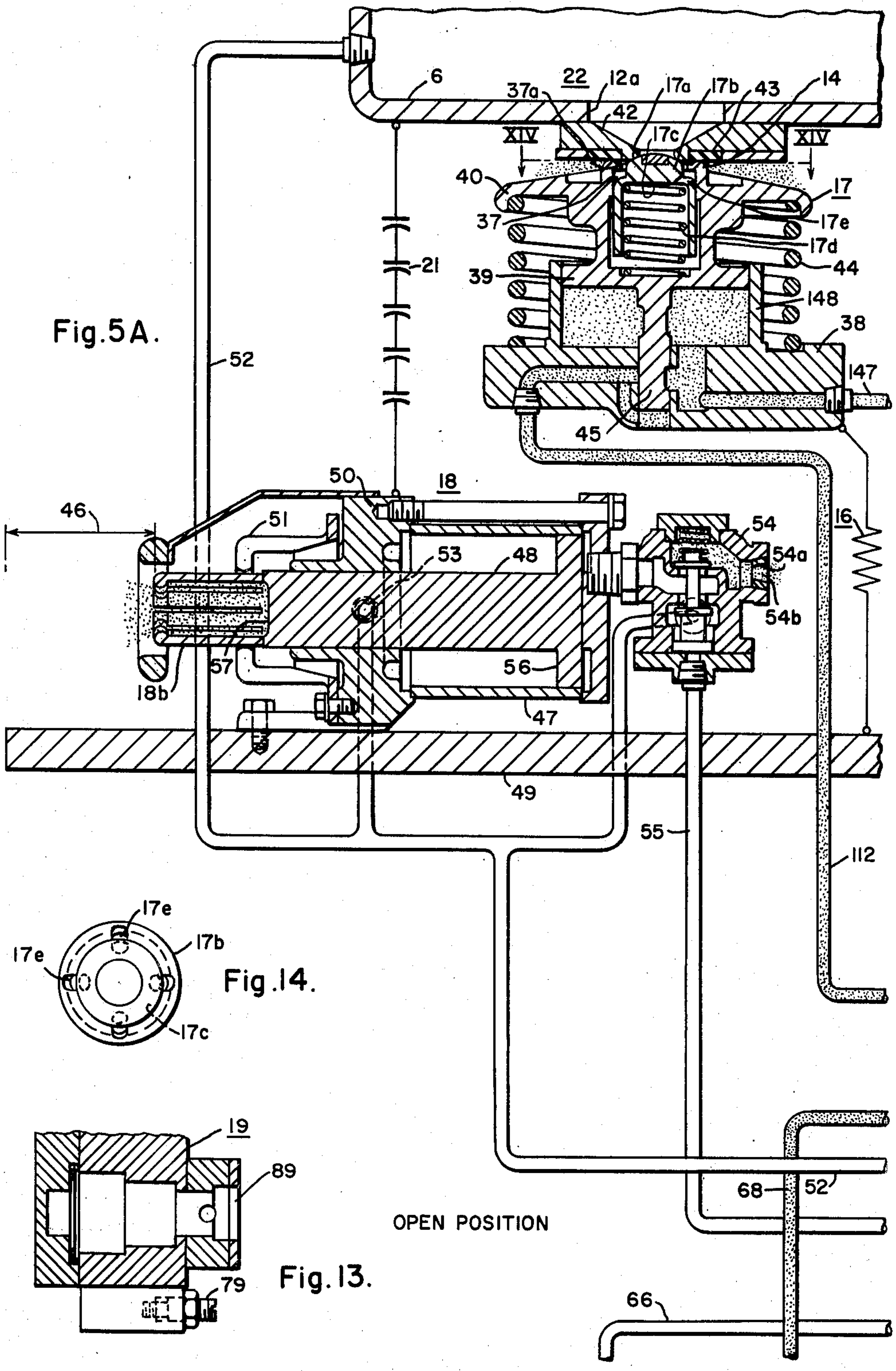
Figure 5B:
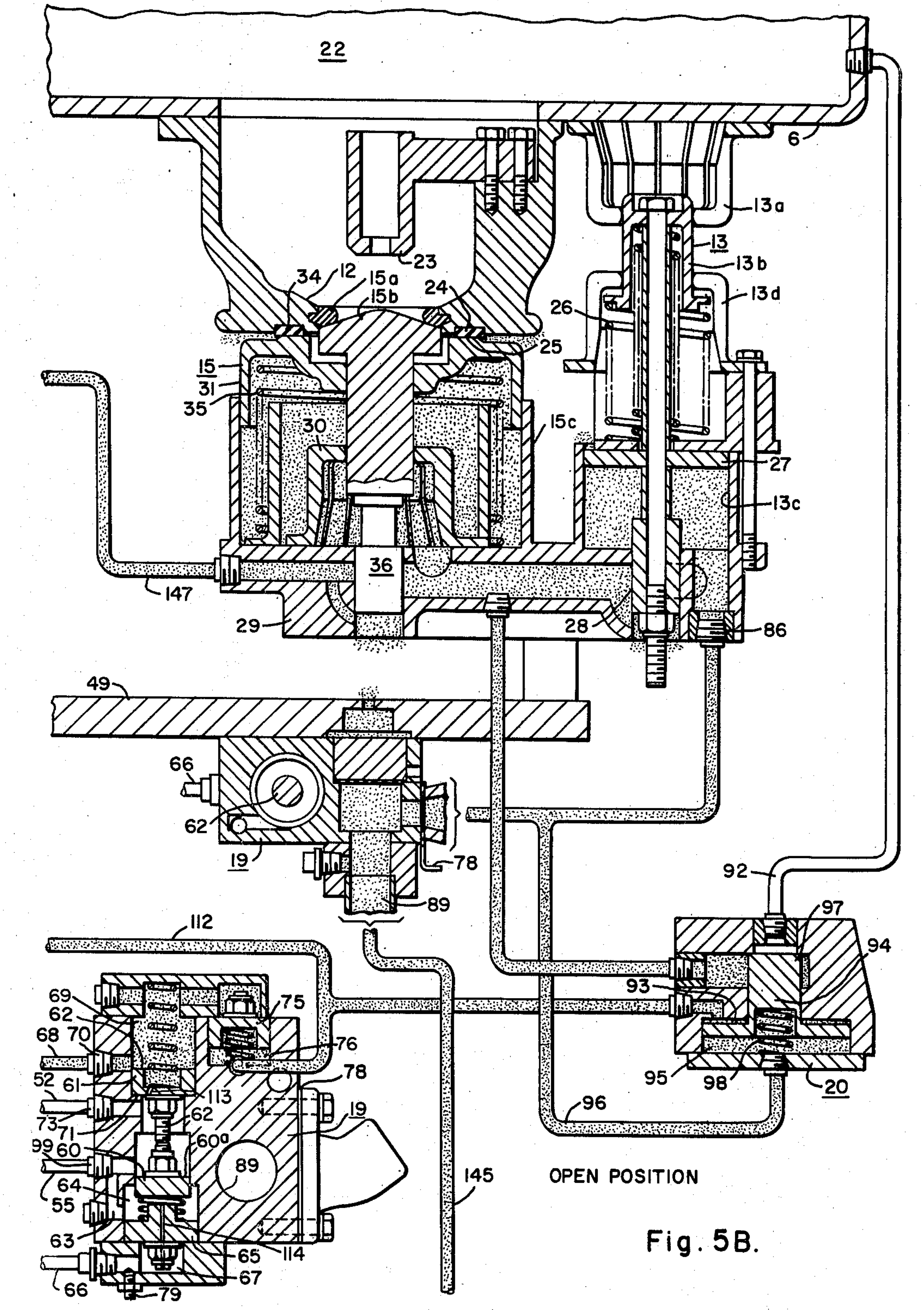
Figure 5C:
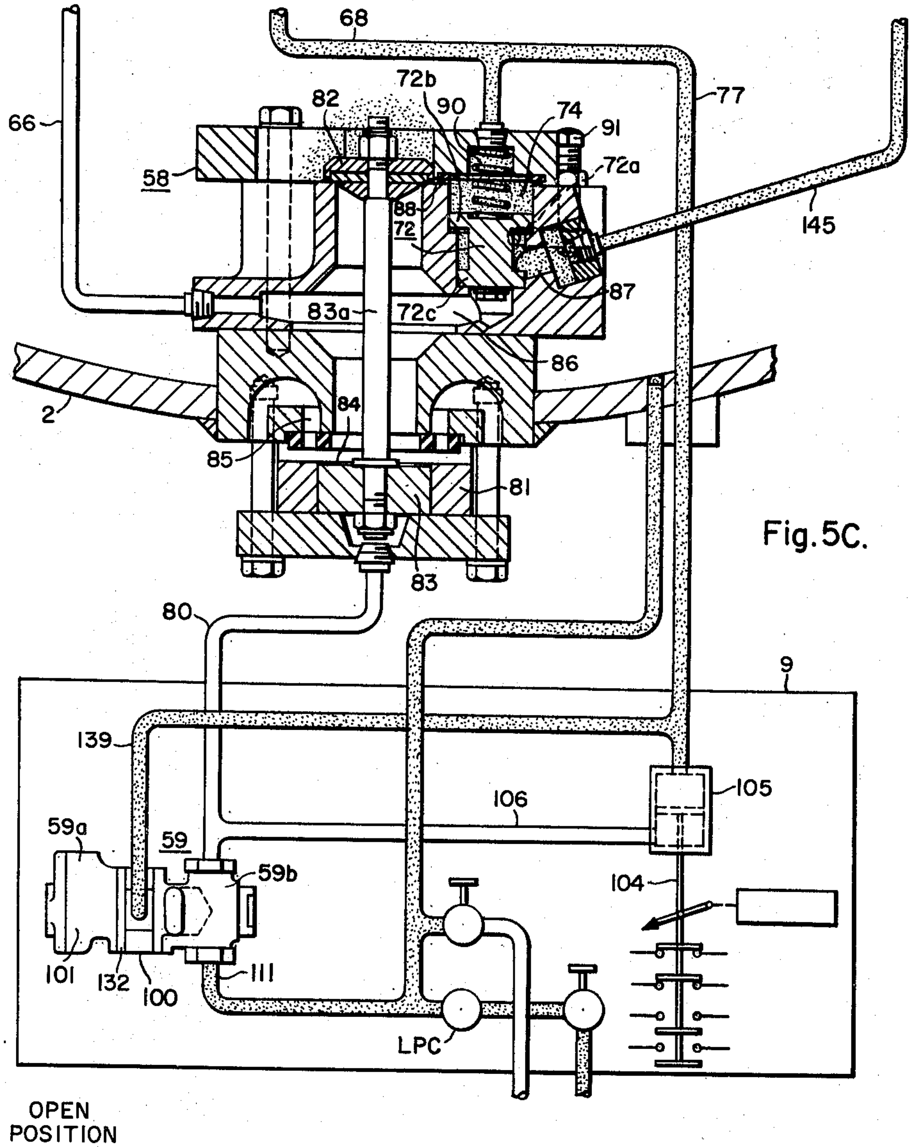
Figure 6:
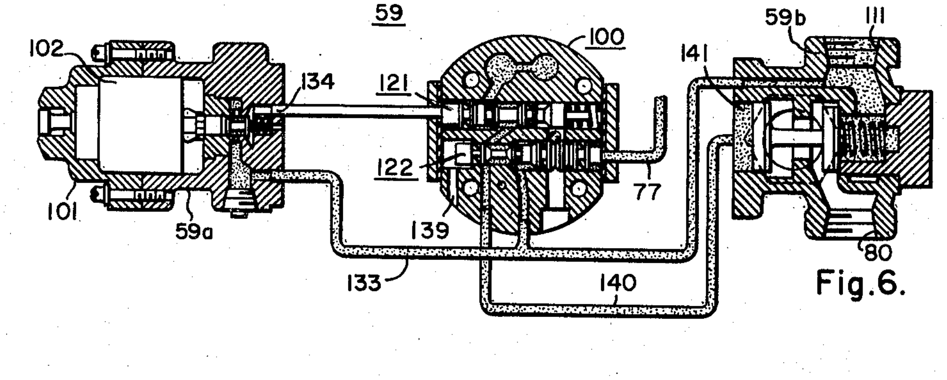
Figure 7:
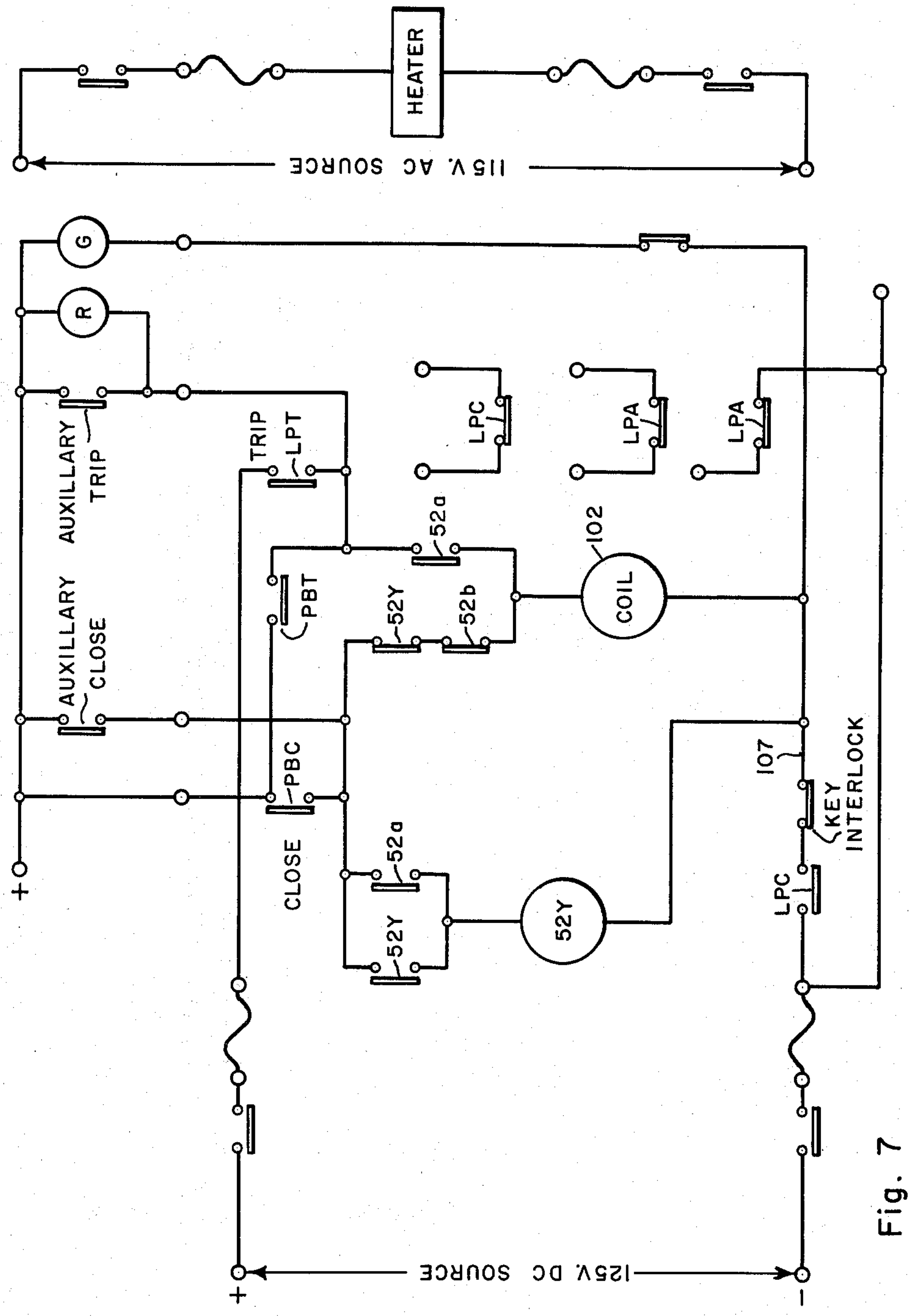

FIGS. 3A, 3B, and 3C collectively illustrate diagrammatically the closed-circuit position of the improved circuit interrupter of the present invention;

FIG. 4 is a sectional view taken through the operating valve for the circuit interrupter of FIGS. 3A–3C, illustrating the closed-circuit position of the interrupter with the operating valve coil de-energized;

FIGS. 5A, 5B and 5C collectively diagrammatically illustrate the circuit interrupter of FIGS. 1 and 2 in the open-circuit position;

FIG. 6 is a view similar to that of FIG. 4, but illustrating the position of the operating valve components corresponding to the FIGS. 5A–5C position of the interrupter;

FIG. 7 illustrates diagrammatically the electrical control for the circuit interrupter;

FIGS. 8–12 illustrate various positions and parts of the index-adapter control-valve assembly of the present invention;

FIG. 13 is a fragmentary detail view of the control unit;

FIG. 14 is a top plan view of the resistor arcing contact; and,

FIG. 15 is an inverted plan view of the double-acting exhaust valve structure.

Referring to the drawings, and more particularly to FIGS. 1 and 2 thereof, the reference numeral 1 generally designates a compressed-gas circuit interrupter. As shown, the circuit interrupter 1 comprises three pole-units X, Y and Z disposed within an enclosing pressurized grounded metallic tank 2. Each pole-unit X, Y or Z includes a pair of serially-related interrupting assemblies 3 secured to, and supported by the lower interior ends **4*a*, 5*b* respectively of terminal bushings 4, 5. As set forth in the aforesaid patent application, Serial No. 59,882, each pair of terminal bushings 4, 5, associated with the interrupting assemblies 3 of each pole-unit X, Y, Z, is provided with a hollow tubular conductor stud adapted for the transmission of exhaust gases during an opening operation of the interrupter. In other words, during the opening operation of the circuit interrupter 1, compressed gas from the pressurized tank 2, which may be at a tank pressure of 260 p.s.i., flows into exhaust chambers 6, which are in pneumatic interconnection with the tubular conductor studs associated with the terminal bushings 4, 5. The exhaust gases from the exhaust chambers 6 flow upwardly through the hollow conductor studs and out through cap structures, not shown, disposed at the upper ends of the terminal bushings. Preferably exhaust-valve structures, not shown, are associated with the upper external ends of the terminal bushings 4, 5 to maintain a predetermined minimum pressure within the hollow conductor studs and within the exhaust chambers 6 in the open and closed-circuit positions of the interrupter 1**.

Current transformers 7 may be associated with the terminal bushings 4, 5 in a manner well known by those skilled in the art, and the secondary leads of the current transformers 7 may extend downwardly through a conduit 8 and into a control housing 9. As shown, the control housing 9 is fixedly secured by bracket members 10, welded to the external side of the grounded tank 2, and preferably encloses suitable electrical and pneumatic control for the operation of the circuit interrupter 1 as more fully described hereinafter. Also associated with the tank structure 2 is a manhole structure 11, including a tank manhole door 11*a* for permitting access to the interrupting assemblies 3 within tank 2. A gasketing arrangement permits entry into the breaker tank 2 when air is exhausted therefrom. The manhole cover 11*a* is double-hinged, and may be opened merely by removing one hinge pin 11*b*. As mentioned hereinbefore, each tank 2 is charged with air at approximately 260 pounds per square inch and thus acts as a compressed-gas storage reservoir. An air drain valve, not shown, is located within the control housing 9, and is connected to the bottom of the tank 2, being used to exhaust the air therefrom when entrance into the breaker tank 2 is desired.

As mentioned hereinbefore, the circuit interrupter 1 has two interrupter assemblies 3 per phase connected in series for essentially simultaneous operation. Therefore, each interrupter assembly 3 performs one-half of the interrupting duty. These assemblies 3 are of the orifice type, and consists of a metal exhaust casting 6 having a central circular opening 12 therethrough, through which compressed air may be blown. During the flow of compressed air through this orifice opening 12, the contacts are separated so that the resulting arc is drawn within the central circular opening, or "throat" causing extinction of the arc and interruption of the circuit. Each interrupter 3 comprises the exhaust chamber 6, the main orifice 12, resistor orifice 12*a* the external main contact structure 13, the main interrupter assembly 15, the resistor assembly 16, the resistor interrupter assembly 17, the isolator assembly 18, the pneumatic control unit 19, and various support and insulating members. In addition, the interrupter assembly 3 includes an auxiliary exhaust valve 20 and a voltage-dividing capacitor 21. For reasons of corrosion resistance and current-carrying capabilities, the component parts are cast, or fabricated from copper alloy, or aluminum with all arcing surfaces of silver-tungsten alloy. All the current-carrying contacting surfaces are silver plated.

As previously mentioned, the exhaust chambers 6 are attached to the lower ends 4*a*, 5*a* of the terminal bushings 4, 5, and are at substantially atmospheric pressure except during circuit interruption. During circuit interruption, the exhaust chambers 6 collect the exhaust air and gases, and discharge them through the hollow bushing conductor studs to the atmosphere.

The main orifice 12 is attached to the exhaust chamber 6 and directs the main blast into the interior region 22 of the exhaust chamber. It includes an orifice casting, the arc horn 23 and the valve seat 24 for the main blast valve 25.

*External main and main interrupter assembly—FIGS. 3A and 3B*

The external main and main interrupting assembly includes the main current contacts 13*a*, 13*b*, the main current interrupting contacts 15*a*, 15*b* and their operating cylinders 13*c*, 31. A main movable interrupter contact piston 15*c* also serves as the main blast valve controlling air flow through the main orifice 12 for interruption. The external main contact 13*b* bridges between the finger contact assembly 13*a* mounted on the exhaust chamber 6 and a similar finger contact assembly 13*d*. This is the principal current-carrying member and parallels the interrupting assemblies. It is normally held in the closed position by springs 26, and is opened by pressure differential when the air below the piston 27 is exhausted. Opening the external main contacts 13*a*, 13*b* inserts the interrupting contacts 15*a*, 15*b* into the circuit. The plunger 28, attached to the movable external main contact 13*b* functions as a control valve to operate the main interrupter 15.

The function of the main interrupter 15 is to interrupt the main current and to transfer the current through the resistor interrupter assembly 17. The essential operating components are the body 29, the fingers 30, the main piston 31, the follower 15*b*, which serves as the main arcing contact, and the cylinder 15*c*. The main blast valve 25 is formed by the main piston 31 sealing against the neoprene seat 34 of the main orifice assembly 15. The main interrupter contacts 15*b* and the main blast valve 25 are maintained in the closed position by spring load of springs 35 and air pressure.

Opening of the blast valve 25 and parting of the main interrupter contacts is accomplished by exhausting the air below the main piston 31. The decreasing air pressure causes a force unbalance, forcing the piston 31 downwardly and opening the blast valve 25 and main movable contact 15*b*. The resulting arc is transferred immediately by the air blast to the center arcing horn 23. Continued motion of the piston 31 stretches the arc through the orifice, where it is interrupted by the flow of air from the breaker tank 2 to the exhaust chamber 6. Interruption transfers the current to the resistor interrupter circuit. The lower end of the follower 36 functions as a slide valve to operate the resistor interrupter assembly 17 after the main movable interrupter contact 15*b* has traveled open a short distance. This introduces a desired time delay in the resistor contact interruption.

After the interruption is completed, and the isolator contacts 18*a*, 18*b* have separated, pressure from the tank 2 is readmitted below the external main and main interrupter pistons 27, 31 permitting the external main and main interrupter contacts and the main blast valve 25 to reclose.

With the interruption of the current at the main interrupter 15, the circuit is transferred to the resistor interrupter 17 and an impedance, such, for example, as a 10 ohm series resistor, thus inserting 20 ohms per phase, in this particular instance, into the circuit. The essential operating components of the resistor interrupter 17 are the valve body 38, the piston 39, the piston head 40, the movable resistor contact 17, the orifice 42, and the valve seat 43. The resistor blast valve 14 is formed by the piston head 40 sealing against the valve seat 43. The main function of the resistor interrupter 17 is to complete the interruption of the circuit through the circuit interrupter 1. The closed position is maintained by spring loading as provided by a compression spring 44 and air pressure. The opening operation of the resistor interrupter 17 is initiated by the slide valve 36 in the main interrupter 15, which exhausts the air below the resistor interrupter piston 39. The decrease in pressure below the piston 39 causes a force unbalance, thereby opening the blast valve 14 and separating the arcing contact 17*b*. Continued motion of the piston 39 stretches the arc through the orifice 42, where it is interrupted by the flow of air from the breaker tank 2 to the exhaust chamber 6.

A slide valve 45 attached to the resistor interrupter piston 40 initiates the operation of the control unit 19, which causes the isolator contacts 18*a*, 18*b* to open after the resistor interrupter contacts 17*a*, 17*b* have separated. When the main interrupter 15 recloses, tank pressure is readmitted below the resistor interrupter piston 39. This permits the resistor contacts 17*a*, 17*b* and the blast valve 14 to reclose.

*"Isolating assembly"—FIG. 5A*

The ideal contact separation for efficient interruption is relatively short. Also, in order to reduce air loss during interruption to a minimum, the interrupter contacts 15*b*, 17*b* and blast valves 25, 14 must be reclosed promptly. Therefore, the isolator contacts 18*a*, 18*b* are provided to open and form thereby a positive disconnect break 46 (FIG. 5A) after interruption has occurred, but before the interrupter 15 is reclosed.

The isolator assembly 18 consists of a pneumatic operating cylinder 47 with the piston rod 48 serving as a moving isolating contact 18*a* or 18*b*. The main current path through the isolator assembly 18 is from the interrupter base plate 49, through the top casting 50, the finger contacts 51, and the moving isolating contact 18*a*, or 18*b* to the mating contact on the opposite terminal bushing.

The front, or top of the isolator assembly 18, is permanently connected to atmosphere by insulating tubing 52 connected between an opening 53 in the top casting 50 and the exhaust chamber 6. In other words the opening side of the operating piston 56 is constantly at relatively low pressure, whereas the pressure on the closing side of the operating piston 56 may be alternated from tank pressure to substantially atmospheric pressure. As mentioned, the back, or bottom of the cylinder 47 can be opened either to tank pressure, or atmospheric pressure, by a three-way normally closed valve 54, which is controlled by pilot pressure 55 from the control unit 19. The breaker 1 is closed by admitting tank pressure behind the piston 56 on the isolator contact 18*a*, or 18*b* thus driving it to the extended position, as shown in FIG. 3A, where it engages a similar contact on the opposite interrupter 3. The isolator is opened by the force of tank pressure on the end of the contact 57 when the back of the cylinder 47 is exhausted to atmosphere.

*Control unit—FIG. 3B*

Proper functioning of the breaker 1 depends upon pneumatic operation of the external main contacts 13, main interrupter 15, resistor interrupter 17, and isolator contacts 18 in the correct sequence. The control unit 19, operating in conjunction with the exhaust valve 58 and interrupter valve 59 described hereinafter, controls this sequence by opening the control lines or tubes to tank pressure or atmospheric pressure in the proper order. One control unit 19 is provided for each interrupter assembly 3.

The isolator pilot piston 60 and the interrupter pilot piston 61 operate as a unit, alternately exhausting the interrupter pilot port 70 or the isolator port 99 through the exhaust port 73. In the "breaker open" position this pilot piston unit 62 is in the normal spring-biased position, as shown in FIG. 5B. This connects the isolator pilot port 99 to the exhaust port 73, maintaining the isolator pilot line 55 at atmospheric pressure. A bypass 63 around the isolator pilot piston 60 also maintains the chamber 64 between this piston 60 and the driver piston 65 at atmospheric pressure. A direct connection 66 to the exhaust valve 58 maintains the chamber 67 in front of the driver piston 65 at atmospheric pressure. Trapped tank pressure in the interrupter pilot line 68 and in the chamber 69 adjacent to the interrupter pilot port 70 is sealed by the gasketed valve seat 71 on the interrupter pilot piston 61 and maintained by leakage past the interrupter control piston 72. In the "breaker closed" position, the pilot piston unit 62 is in the position shown in FIG. 3B. This connects the interrupter pilot port 70 to the exhaust port 73, maintaining the interrupter pilot line 68 and the chamber 74 above the interrupter control piston 72 at atmospheric pressure. Tank pressure in the isolator pilot line 55 is sealed by the gasketed valve seat 60*a* on the isolator pilot piston 60 and maintained by leakage or air flow from the exhaust valve 58 past the driver piston 65.

The driver piston 65 is exposed to pressure from the exhaust valve 58 on a closing operation and provides the initial driving force to move the pilot piston unit 62 to its breaker-closed position. It also serves as a check valve to hold the trapped pressure in the isolator pilot line 55 on an opening operation, and prevents opening of the isolator contacts 18*a*, 18*b* until control unit 19 operation is initiated by the resistor interrupter 17.

The function of the isolator delay piston 75 is to delay the opening of the isolator contacts 18*a*, 18*b* on an opening operation until the resistor interrupter 17 has opened. It is actuated by pressure differential when operation of the resistor interrupter 17 permits the chamber 76 behind the piston 75 to be exhausted, and admits tank pressure behind the interrupter pilot piston 61. This drives the pilot piston 61 unit to its breaker open position, initiating the opening of the isolator 18 and the reclosing of the interrupters 15, 17 and the external main contacts 13.

A "sensing line" 77 from port 70 of one control unit 19 to the control housing 9 serves as a pressure indication of the isolator contact position.

Throttling adjustments are provided to assure approximately simultaneous operation of the three poles A, B and C. A member 78 (FIG. 3B) is a slotted plate, adjustable, when necessary, to restrict the exhaust path between the control unit 19 and external main contact of one interrupter and coordinate its opening speed with that of slower interrupters. Item 79 (FIG. 13) is a screw-type adjustment that can be used to restrict the air passage controlling the isolator closing time.

*Exhaust valve and interrupter valve—FIG. 3C*

The exhaust valve 58 is operated by pilot pressure 80 from the operating valve 59 in the control housing 9, and provides the large exhaust ports necessary for fast operation of the interrupters 3. It consists of an operating cylinder 81 and valve assembly 82 mounted in the bottom of the tank 2. Exhausting the volume below the piston 83 permits tank pressure to push the piston and rod assembly 83, 83*a* downwardly. This closes the upper valve 82, isolating the exhaust lines 66 from the tank pressure. It also opens the lower valve 84, connecting them to atmosphere through ports 85 in the top of the cylinder 81. This is the normal breaker open position. Admitting pressure below the piston 83 pushes the piston and rod assembly 83, 83*a* upwardly, closing the lower valve 84 and opening the upper valve 82 to admit tank pressure to the exhaust line 66. This is the "breaker closed" position.

The interrupter control piston 72 serves as an interlocking inlet valve to open the external main contact port 86 either to tank pressure or to the exhaust valve. This is a differential-area valve piston having an opening 72*a* (FIG. 15) to the interior of the tank 2. The annular upper area 72*b* of the differential piston 72 is larger than the lower annular area 72*c*, as shown in FIG. 3C. This valve corresponds with valve 76 of the aforesaid application, and functions in the same manner. Although for the 115 kv. voltage rating shown, it is associated with lower exhaust valve assembly 58, for the lower voltage ratings, such as 46 kv. not shown, it may be a part of the control unit 19, as was the case in the aforesaid application S.N. 59,882. The chamber 74 above this piston 72 is connected to, and receives pilot pressure from port 70 of the control unit 19. When the breaker is opened (exhaust valve 58 open to atmosphere) this chamber 74 and port 70 are at tank pressure maintained by leakage past the piston 72. Thus, this piston 72 is held down, sealing the exhaust valve port 87, and opening the external main contact port 86 to tank pressure through opening 72*a*. When the breaker is closed (exhaust valve 58 open to tank pressure) the pilot pressure from port 70 is at atmosphere; and the differential piston 72 is up and sealed against the gasket seat 88. Thus the port 70 directly to tank pressure 72*a* is blocked, and the external main contact port 86 is opened to the exhaust valve port 85 ready for an opening operation. On an opening operation, port 70 and the upper chamber 74 remain at atmospheric pressure until control unit 19 action is initiated by the slide valve 45 in the resistor interrupter 17. Tank pressure, acting on the differential area of the piston 72, holds the piston 72 up maintaining an open exhaust path from the interrupter to the exhaust valve 58 until the opening sequence is completed. Pressure from port 70 then drives the piston 72 downwardly, closing the exhaust valve port 87 and readmitting tank pressure to the external main contact port 89 to reclose the interrupters 15, 17 and external main contacts 13. The spring 90 assists gravity in closing the exhaust valve port 87 when pressure is exhausted from the tank for maintenance. This prevents an air leak at this point until the pressure has built up sufficiently for the operating valves to set up correctly when refilling the tank.

Member 91, FIG. 3C, is a screw-type adjustment which can be used to throttle the air passage controlling the external main contact and interrupter reclosing time. Preferably the circuit interrupter 1 includes two exhaust valve and interrupter valve assemblies 58, each controlling three interrupters 3.

*Auxiliary exhaust valve—FIG. 3B*

FIGS. 3B and 5B show an auxiliary exhaust valve 20 used to provide faster opening. This valve 20 is mounted on the interrupter base plate 49 and opens to provide an auxiliary exhaust line 92 from the main interrupter operating cylinder 13*c* direct to the exhaust chamber 6. The chamber 93 above the piston 94 is connected to the resistor interrupter slide valve 45 and is at tank pressure except while the resistor interrupter 17 is open. The chamber 95 below the piston 94 is connected to the exhaust line 96 leading from the external main contact 13*b* to the exhaust valve 58. It is at tank pressure except while the external main and main interrupter operating cylinders are being exhausted.

When the exhaust line 145 is open to atmosphere, the pressure differential drives the piston 94 downwardly opening the valve 97. This valve 97 operates at approximately the same pressure differential as the external main contacts, and provides faster exhaust of the main and resistor interrupters. When the resistor interrupter opens, exhausting the chamber 93 above the piston 94, the valve 97 is reclosed by the spring 98. Re-admission of pressure to the lower valve chamber 95, when the interrupter control piston 72 operates to reclose the interrupter, seals the valve 97 in the closed position until the next opening operation.

*Control Housing—FIG. 3C*

The weatherproof dust-tight sheet-metal control housing 9 contains a number of accessories essential to the proper operation of the breaker. These include the air-control valves, control switches and relay, protective breakers, auxiliary switches, protective pressure switches, pressure gauge, position indicator, operation counter, key interlocks for the necessary interlocking with other apparatus, and terminal blocks for terminating all wiring where it will be readily accessible for connections on installation. A heater is provided to maintain a temperature differential between the inside and outside to prevent undesirable moisture condensation within the housing 9.

Disposed within the control housing 9 is a three-way, normally-open, solenoid-operated, air valve which initiates the breaker operation by admitting pressure to the exhaust valve cylinder 81 for closing or exhausting it for opening. An air-index adapter 100, shown schematically in FIGS. 8–12, is included as an integral part of the operating valve 59. The index adapter 100 is actuated by the solenoid, or pilot section 101 of the valve 100 and by pressure from the sensing line 77. It sets up for a closing or opening operation depending upon the condition of the sensing line 77. If the sensing line 77 is at tank pressure, indicating open breaker contacts, energizing the solenoid coil 102 will move the valve to the open position thus admitting pressure to the exhaust valve cylinder 81 and initiating a closing operation. If the sensing line 77 is at atmospheric pressure, indicating closed breaker contacts, energizing the coil 102 will move the valve to the closed position, thus exhausting the exhaust valve cylinder 81 and initiating an opening operation. When the index adapter 100 is moved to either the open or closed position, it locks itself in that position and will not change until the coil 102 is again energized.

If air pressure is drained or lost from the breaker tank 2, the operating valve 59 will remain in or moved to its spring-biased normally open position. No change will occur, however, until the tank pressure has dropped low enough to make the interrupters and isolators inoperative. Thus the position of the breaker contacts will remain unchanged. The index adapter 100 is spring-biased in its locked position, so no change occurs upon loss of air pressure. Upon refilling the tank 2, the operating valve 59 and breaker contacts will reset to the last-operated position even though the contact may have been moved during maintenance.

One or two eleven-pole auxiliary switches with independently adjustable contacts are provided in the control housing 9 for use in cut-off, interlocking, indicating, alarm, and trip circuits. The switches are connected to the piston rod 104 of a pneumatic cylinder 105, which is operated by the pressure differential between the sensing line 77 and the pilot line 106 from the operating valve 59 to the exhaust valve 58. Thus the switches indicate the position of the breaker contacts. The linkage between the switches and operating cylinder includes a red and green semaphore which is visible through a window in the housing 9 and serves as a visual position indicator. In addition, an operation counter is mounted in the control housing 9 and operated by the auxiliary switch operating arm. The counter records on the opening stroke.

To ensure against the breaker attempting to close when there is insufficient air pressure in the reservoir to complete the operation, a low-pressure cut-out switch LPC, located in the air-supply system between the inlet valve and the operating valve, has its contact connected in the closing circuit 107 (FIG. 7). The low-pressure cut-out switch contacts are normally closed, but open before the critical operating pressure is reached.

To insure against the breaker remaining closed with insufficient air for a successful trip, a low-pressure trip switch LPT (FIG. 7) is located in the air-supply system between the inlet valve and the operating valve and has its contacts in the trip circuit. With normal operating pressure in the pole-unit tanks 2 the low-pressure trip switch contact is normally open, but closes with loss of air pressure, tripping the breaker before the critical operating pressure is reached.

A low-pressure alarm pressure switch operates an electrical alarm and indicator which will warn of approaching critical low pressure.

*Control scheme—FIG. 7*

The provide for remote and semi-automatic control of the operating valve 59, and to assure non-pumping operation of the breaker 1, a cut-off relay is included in the control housing 9. Referring to the wiring diagram of FIG. 7, the cut-off relay, designated as 52Y, is pictured in the de-energized position. The arrangement, as shown, provides an electrically trip-free, non-pumping scheme.

A single operating coil 102 initiates both closing and opening operations of the operating valve 59, which is basically air operated by pressure from the sensing line 77. Momentarily energizing the coil 102 permits the operating valve 59 to reverse its position, to correspond to the sensing line 77 condition, and stay put until the coil 102 is again energized after breaker operation has reversed the sensing line 77.

The electrically trip-free feature is provided by a normally-closed auxiliary switch, designated as "B," in the closing circuit and a normally-open auxiliary switch contact designated as "*a*," in the trip circuit. On a closing operation, the reversing sensing line 77 condition operates the auxiliary switch, opening the "*b*" contact, thus setting up the trip circuit ready for an opening operation. If the trip contact is already closed, when the breaker closes, simultaneous closing of the auxiliary switch "*a*" contact and reversal of sensing line 77 condition at the operating valve index adapter 100 results in instantaneous tripping. On an opening operation, the "*a*" contact in the trip circuit opens, and the "*b*" contact closes, thus setting up the closing circuit ready for a closing operation.

To provide the non-pumping feature, a normally-closed cut-off relay contact is connected in series with the "*b*" contact in the closing circuit. When the breaker closes, the cut-off relay coil is energized through the closed contact and an auxiliary switch "*a*" contact, and is "sealed in" by a normally open contact of the relay. This opens the closing circuit and prevents its reclosure until the operator releases the control switch thus de-energizing the cut-off relay. If the breaker fails to close, or if it is tripped immediately after being closed, the closing circuit is "locked out" until the control switch is released and then reclosed.

With reference to FIGS. 8–12, it will be noted that the index-adapter valve assembly 100 includes a movable control spool 121 and a movable actuator spool 122. As shown, the movable control spool 121, disposed on the left, as view in FIG. 8, carries three seals, 123–125. The lower seal 123 serves as a piston seal for the piston portion 126 of the control spool 121. The middle seal 124 forms a straight-way valve, and the upper seal 125 is also a piston seal.

Figures 8, 9, 10, 11, 12:
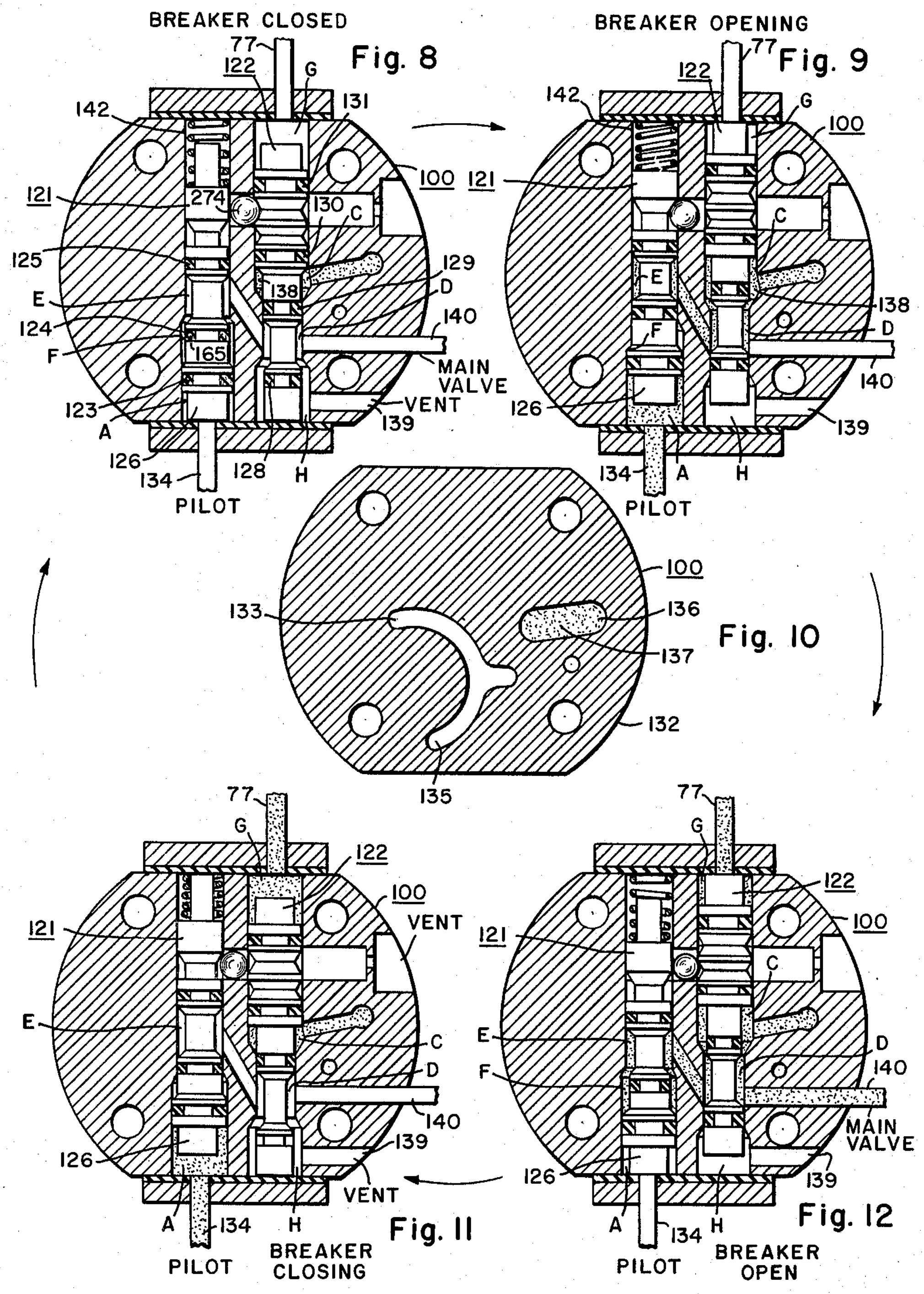

The movable actuator spool 122, disposed on the right, as view in FIG. 8, carries four seals 128–131, the lower two seals forming a three-way valve, and the upper two seals serving as piston seals. The gasket 132, shown in FIG. 10, is, for example, 1/16 inch thick, and is placed between the air index adapter 100 and the pilot section **59*a*. Point 133 is the point of application of pilot outlet pressure, which is obtained from the outlet 134 (FIG. 6) of the pilot valve section 59*a*, which is contiguous to the gasket 133. Through the gasket slot 135 the pilot pressure is transmitted to the lower portion of the control spool assembly, as indicated schematically in FIG. 6 by the pilot-outlet connection 134**.

Constant pilot supply pressure is maintained at portion 136 (FIG. 10) of gasket slot 137. Thus, the connection 133 may be connected to portion 136 of FIG. 10. By reason of the gasket slot 137, this high pressure is transmitted to the chamber 138 to supply the actuator spool functions. A vent 139 is provided, as well as the connection 140 leading to the operating cylinder 141 for actuating the main operating valve **59*b* of main valve 59** of FIG. 6.

*Sequence of operation or air-index adapter section 100—FIGS. 8–12*

FIG. 8—Pilot chamber "A" exhausted:

(1) Control spool 121 is spring-returned down by spring 142.

(2) After actuator spool 122 is locked down by downward movement of the control spool 121, chamber "F" is exhausted through "E," "D," and "H." Chamber "G" is exhausted by the pressure sensing line 77.

(3) Main valve operating piston chamber 141 remains exhausted.

(4) These positions are in accordance with the breaker-closed position.

FIG. 9—Pilot chamber "A" pressurized:

(1) Control spool 121 is moved up.

(2) Straight-way valve between chambers "E" and "F" is closed, after which actuator spool 122 is unlocked.

(3) Inlet pressure from constant pilot supply at 136, acting in chamber "C," acts on unequal areas of actuator spool 122'' in chamber "C" and actuator spool 122 is moved up, closing exhaust port 139 and opening chambers "D" and "E" to pressure.

(4) Main valve operating piston chamber 141 is pressurized.

(5) This corresponds to the breaker openings position.

FIG. 12—Pilot chamber "A" exhausted:

(1) Control spool 121 is spring returned down.

(2) After actuator spool 122 is locked up by the downward movement of the control spool 121, the straight-way valve between chambers "E" and "F" is opened.

(3) Chamber "F" is pressurized.

(4) Chamber "G" is pressurized from the pressure sensing line 77.

(5) Main valve operating piston chamber 141 remains pressurized.

(6) The foregoing positions correspond with the breaker open position.

FIG. 11—Pilot chamber "A" pressurized.

(1) Control spool 121 is moved up.

(2) Straight-way valve between "E" and "F" is closed, trapping in chamber "F." Chamber "G" is pressurized from the pressure sensing line 77.

(3) Actuator spool 122 is unlocked.

(4) Trapped pressure moves actuator spool 122 down, closing inlet port "C" and opening chambers "D" and "E" to exhaust.

(5) Main valve operating piston chamber 141 is exhausted.

(6) The foregoing position of the parts corresponds to the breaker-closing position.

Pilot chamber "A" is exhausted.

(1) Cycle is repeated, see FIG. 8 and sequence above.

*Closing Operation—FIGS. 5A–5C*

The closing operation is best understood by reference to FIGS. 5A–5C, which shows the breaker open and de-energized, and ready to be energized to close.

The closing operation is started by energizing the coil 102 of the operating valve 59, which moves to the open position, closing the exhaust port and admitting pressure to the pilot line 80 leading to the exhaust valve 58. The pressure admitted to the bottom of the exhaust valve cylinder 81 drives the piston and rod assembly upwardly, closing the lower valve 84 and opening the upper valve 82 to admit tank pressure to the exhaust lines 68 leading to the control units 19. This applies pressure to the bottom of the interrupter control piston 72 and to the front of the driver piston 65. Pressure on the driver piston 65 drives it, the isolator pilot piston 60, and the interrupter pilot piston 61 toward their "breaker closed" position; thus closing the passage from the isolator pilot port 99 to the exhaust port 73, and opening the interrupter pilot port 70 to the exhaust port. As the driver piston 65 passes the by-pass port, pressure admitted to the isolator pilot line 55 operates the three-way isolator control valve 54, admitting tank pressure behind the isolator piston 56. This drives the isolator contact **18*a*, 18*b* to the closed position and completes the closing operation. Opening port 70 to the exhaust port exhausts the pilot chamber above the interrupter control piston 72 permitting it to move up and reset for an opening operation. The sensing line 77 connected to port 70 of one control unit 19 is also exhausted giving a "breaker closed" indication to the auxiliary switches 144, position indicator and operating valve index adapter. As the isolator pilot port is uncovered, pressure admittted behind the driver piston 65 continues to drive the isolator pilot piston 60 to its valve seat. Small holes through the interrupter pilot piston permit the escape of trapped pressure. Equalized pressure on the front and back of the driver piston 65** permits it to return to its spring-biased position.

*Opening operation—FIGS. 3A–3C*

The opening operation is best understood by reference to FIGS. 3A–3C, which shows the breaker closed and deenergized, and ready to be energized to open.

The opening operation is started by energizing the coil 102 of the operating valve 59, which moves to the closed position, closing the inlet and exhausting the pilot line 80 leading to the exhaust valve 58. Reduced pressure in the bottom of the exhaust valve cylinder 81 permits tank pressure to drive the piston and rod assembly downwardly, closing the upper valve 82 and opening the lower valve 84 thus exhausting the lines leading to the control unit 19. Since the interrupter control piston 72 is up, this exhausts the line 145 leading to the external main contact cylinder **13*c*. It also exhausts the chamber in front of the driver piston 65; however, the driver piston 65 acts as a check valve and prevents the exhaust of pressure behind it. As the external main contact cylinder 13*c* is exhausted the piston 27 is driven downwardly opening the contacts 13*a*, 13*b* and operating the plunger 28 which exhausts the main interrupter cylinder 15*c*. The auxiliary exhaust valve 20 opens simultaneously with the external main contact 13*b* providing a parallel exhaust line direct to the exhaust chamber 6 for faster exhaust of the main interrupter cylinder 15*c*. Pressure differential drives the main interrupter piston 31 downwardly opening the main blast valve 25 and parting the contacts 15*a*, 15*b* to transfer the current to the resistors 16. The valve 36 in the main interrupter 15 opens the exhaust path 147 to the resistor interrupter 17. As the resistor interrupter cylinder 148 is exhausted, pressure differential drives the piston 39 downwardly, opening the resistor interrupter blast valve 14 and parting the contacts 17*a*, 17*b* to complete the interruption. The valve 45 in the resistor interrupter 17 opens the exhaust path to the chamber behind the control unit isolator delay piston 75, permitting it to open and admit tank pressure behind the interrupter pilot piston 61. Tank pressure acting on the larger area of the interrupter pilot piston 61 drives the pilot piston unit 62 to its normal "breaker open" position. This exhausts the isolator pilot line 55, permitting the isolator contacts 18*a*, 18*b* to open; and admits pressure through port 70 to the top of the interrupter control piston 72 permitting the external main contact 13*b* and interrupters 15, 17 to reclose. Pressure admitted through port 70 to the sensing line 77 also gives a "breaker open" indication at the control housing 9. Reclosing the resistor interrupter 17 readmits tank pressure behind the isolator delay piston 75**, permitting it to return to its normal spring-biased position.

*Close-open or trip-free operation*

If an attempt is made to close the breaker on a fault, the breaker will continue its normal closing operation. The movement of the control unit pilot piston unit 62, which initiates the closing of the isolator contacts **18*a*, 18*b* also exhausts the interrupter pilot line and the sensing line 77. This causes the interrupter control piston 72 and the operating valve index adapter 100** to reset for an opening operation, and closes an auxiliary switch "*a*" contact in the trip circuit. Tripping of the breaker by the protective relay is initiated as the auxiliary switch contact closes. The opening of the breaker and the operation of the interrupters is the same as with the straight opening operation. The cut-off "Y" relay, which picks up and "seals-in" as the breaker closes, opens the closing circuit and prevents reclosing the breaker until the closing switch is released and again closed.

As set forth above, it will be apparent that there are considerable modifications and added improvements covered by the present invention over that set forth in the said patent application Serial No. 59,882. A very important change is the modification of the pneumatic control scheme affecting the operating of the isolator 18. As noted, the front 57 (or contact stem end) of the isolator cylinder, formerly connected to and pressurized or exhausted through the control unit, is connected directly to the exhaust chamber 6 and remains permanently at atmospheric pressure. The force of the reservoir pressure on the end 57 of the contact stem thus becomes the opening force on the isolator 18. Since the front of the cylinder 47 is not pressurized, the time formally required for exhausting it is eliminated, closing speed can thereby be greatly increased, and closing time is reduced.

It will also be noted that there is provided in the present pneumatic arrangement a ¾ inch three-way normally-closed air pressure pilot operated valve 54 added to the back of the isolator assembly 18 and interposed between the isolator 18 and the control unit 19. This makes it possible to admit reservoir pressure directly to the cylinder 47 or exhaust the cylinder 47 directly to the exhaust chamber 6, thus greatly increasing the operating speed. The air flow capacity of the control unit 19 and pilot line 55 thus needs to be adequate only to supply pressure to the pressure pilot of the valve 54. A pipe plug **54*a* with a drilled hole through the center thereof serves as a throttle in the inlet 54*b* of the isolator control valve 54 and controls the isolator operating speed. The isolator operating speed can readily be changed as desired by replacing this plug 54*a*** with a plug having a larger or smaller size hole therein.

The sequencing valve, such as item 51 in the aforesaid patent application, Serial No. 59,882, to delay reclosing of the interrupter until the isolator opened, is omitted in the present improved pneumatic arrangement. The pilot pressure conditions controlling the opening of the isolator 18 and the reclosing of the interrupter are initiated simultaneously by the control unit 19. Due to changes described above, the isolator opening time is consistently shorter than the interrupter reclosing time, and the sequencing valve 51 is no longer needed. This simplifies the control tubing, and permits earlier reclosing of the interrupter with consequent reduction in the amount of air used for interruption.

Another change in the improved version is the provision of three ⅛ inch diameter holes added to piston 61 and a bleeder hole added through the center of driver piston 65. Moreover, throttles are added for interrupter opening time adjustment, isolator closing time adjustment and external main reclosing time adjustment. These may be partially closed as required to slow the operation of faster interrupters 3 and provide simultaneous operation of all interrupters 3.

It will also be noted that the exhaust valve 58 of the present pneumatic arrangement has been considerably changed over that of the prior patent application by giving a more favorable balance of forces as pilot pressure below the piston is reduced. Opening of the valve starts at a higher pilot pressure resulting in faster operation. Reduction of the piston and cylinder diameter is possible because the added O-ring seal eliminates the necessity of the piston sealing against the outer seal surface of the double seal gasket. This also permitted shortening and streamlining the air flow passages through the exhaust valve 58. Such a change considerably reduces the circuit breaker opening time.

Voltage shields are preferably provided to result in more uniform voltage gradient at points of high dielectric stress on the interrupting assemblies, thereby improving the voltage withstanding capability of the circuit breaker.

It will be noted that the movable resistor arcing contact 17*b* has a cavity 17*c* provided on the rear side of the contact head portion thereof, within which is disposed a contact biasing spring 17*d*. A plurality in this particular instance four, holes or apertures 17*e* (FIG. 14) are provided around the periphery of the contact head. In the closed position, as shown in FIG. 3A substantially atmospheric pressure exists within the cavity 17*c*. This arises due to the fact that the annular blast valve 14 is disposed externally of the contact and communication takes place from the cavity 17*c* through the holes 17*e* to the region 22 internally of the exhaust chamber 6. The walls of the exhaust chamber 6, in effect, constitute side walls of a pressurized enclosure 2.

During interruption of the resistor current, the actuating piston 39 moves downwardly opening the annular blast valve 14. This permits high pressure gas to pass through the holes 17*e* thereby building up the pressure within cavity 17*c* and stabilizing the movement of the movable resistor arcing contact 17*b* causing it to firmly remain in engagement with stationary contact 17*a* until forceably mechanically driven downwardly by the take-up of the lost-motion 37. When this occurs, the flange portion 37*a* of actuating piston 40 strikes arcing contact 17*b* and the piston and arcing contact move downwardly together as a unit, drawing the resistor current arc, which is extinguished by the gas blast.

From the foregoing description, it will be apparent that there is provided an improved and highly simplified pneumatic control scheme for a compressed gas circuit interrupter and also improved modifications of the interrupting units themselves. The result has been to provide a high speed, simplified compressed gas circuit interrupter readily adapted for the higher voltage ranges, such as 46 kv. and 115 kv. rendering effective performance.

Although there has been illustrated and described a specific structure, it is to be clearly understood that the same was merely for the purpose of illustration and that changes and modifications may readily be made therein by those skilled in the art without departing from the spirit and scope of the invention.

We claim as our invention:

1. The combination in a compressed-gas circuit interrupter of a pressurized enclosure containing an arc-extinguishing gas under pressure, an interrupting assembly and a serially connected disconnecting switch structure disposed within said pressurized enclosure, said interrupting assembly including one or more piston-actuated contacts separable to establish an arc, said disconnecting switch structure including an operating cylinder and an operating piston secured to a generally rod-shaped movable disconnecting contact, the operating piston being movable within said operating cylinder, the opening side of the operating piston within the operating cylinder being constantly at a relatively low pressure, said rod-shaped movable disconnecting contact having an end portion subject to the pressure within said pressurized enclosure for moving it in the opening direction, and means for alternating the pressure on the closing side of the operating piston from tank pressure to said relatively low pressure for effecting the respective closing and opening movements of the movable disconnecting contact.

2. The combination in a compressed-gas circuit interrupter of a pressurized enclosure containing an arc-extinguishing gas under pressure, an interrupting assembly and a serially connected disconnecting switch structure disposed within said pressurized enclosure, said interrupting assembly including one or more piston-actuated contacts separable to establish an arc, said disconnecting switch structure including an operating cylinder and an operating piston secured to a generally rod-shaped movable disconnecting contact, the operating piston being movable within said operating cylinder, the opening side of the operating piston within the operating cylinder being constantly at a relatively low pressure, said rod-shaped movable disconnecting contact having an end portion subject to the pressure within said pressurized enclosure for moving it in the opening direction, and means including a three-way isolator control valve communicating to tank pressure for alternating the pressure on the closing side of the operating piston from tank pressure to said relatively low pressure for effecting the respective closing and opening movements of the movable disconnecting contact.

3. The combination in a compressed-gas circuit interrupter of a pressurized enclosure containing an arc-extinguishing gas under pressure, an interrupting assembly including a pneumatic control unit and a serially connected disconnecting switch structure disposed within said pressurized enclosure, said interrupting assembly including one or more piston-actuated contacts separable to establish an arc, said disconnecting switch structure including an operating cylinder and an operating piston secured to a generally rod-shaped movable disconnecting contact, the operating piston being movable within said operating cylinder, the opening side of the operating piston within the operating cylinder being constantly at a relatively low pressure, said rod-shaped movable disconnecting contact having an end portion subject to the pressure within said pressurized enclosure for moving it in the opening direction, and means including a three-way isolator control valve communicating to tank pressure and having a pilot line to said pneumatic control unit for alternating the pressure on the closing side of the operating piston from tank pressure to said relatively low pressure for effecting the respective closing and opening movements of the movable disconnecting contact.

4. The combination of claim 3, wherein adjustably apertured pipe plugs may be disposed in the tank inlet opening of the three-way isolator control valve for controlling the closing speed of the movable disconnecting contact.

5. In combination, a compressed-gas circuit interrupter including a grounded metallic pressurized tank, one or more pairs of terminal bushings extending within said pressurized tank, at least one terminal bushing having a hollow conductor stud for the exhaust of gas, an interrupting assembly secured to the interior end of said one terminal bushing, a serially connected disconnecting switch structure, the interrupting assembly including piston-actuated separable arcing contacts with the exhaust gas blasting through said hollow conductor stud, said disconnecting switch structure including an operating cylinder and operating piston secured to a generally rod-shaped movable disconnecting contact, the operating piston being movable within said operating cylinder, the opening side of the operating piston within the operating cylinder being constantly at a relatively low pressure, said rod-shaped movable disconnecting contact having an end portion subject to the pressure within said pressurized enclosure for moving it in the opening direction, and means for alternating the pressure on the closing side of the operating piston from tank pressure to said relatively low pressure for effecting the respective closing and opening movements of the movable disconnecting contact.

6. In combination, a compressed-gas circuit interrupter including a grounded metallic pressurized tank, one or more pairs of terminal bushings extending within said pressurized tank, at least one terminal bushing having a hollow conductor stud for the exhaust of gas, an interrupting assembly secured to the interior end of said one terminal bushing, a serially connected disconnecting switch structure, the interrupting assembly including piston-actuated separable arcing contacts with the exhaust gas blasting through said hollow conductor stud, said disconnecting switch structure including an operating cylinder and an operating piston secured to a generally rod-shaped movable disconnecting contact, the operating piston being movable within said operating cylinder, the opening side of the operating piston within the operating cylinder being constantly at a relatively low pressure, said rod-shaped movable disconnecting contact having an end portion subject to the pressure within said pressurized enclosure for moving it in the opening direction, and means including a three-way isolator control valve communicating to tank pressure for alternating the pressure on the closing side of the operating piston from tank pressure to said relatively low pressure for effecting the respective closing and opening movements of the movable disconnecting contact.

7. The combination in a compressed-gas circuit interrupter including a grounded metallic pressurized tank, a plurality of pairs of terminal bushings extending within said pressurized tank, at least one terminal bushing of each pair of terminal bushings having a hollow conductor stud for the exhaust of gas, an interrupting assembly secured to the interior end of each said one terminal bushing of each pair of terminal bushings, a serially connected disconnecting switch structure associated with each interrupting assembly, each interrupting assembly including piston actuated separable arcing contacts with the exhaust gas blasting through the hollow conductor stud associated therewith, the disconnecting switch structure associated with each pair of terminal bushings including an operating cylinder and operating piston secured to a generally rod-shaped movable disconnecting contact, the operating piston being movable within said operating cylinder, the opening side of the operating piston within the operating cylinder being constantly at relatively low pressure, said rod-shaped movable disconnecting contact having an end portion subject to the pressure within said pressurized enclosure for moving it in the opening direction, and means including a three-way isolator control valve associated with each disconnecting switch structure and communicating to tank pressure for alternating the pressure on the closing side of the operating piston from tank pressure to said relatively low pressure for effecting the respective closing and opening movements of the movable disconnecting contacts.

8. In combination, a compressed-gas three-phase circuit interrupter including a grounded metallic pressurized tank, a plurality of pairs of terminal bushings extending within said pressurized tank, at least one terminal bushing of each pair of terminal bushings having a hollow conductor stud for the exhaust of gas, a plurality of interrupting assemblies, one assembly associated with each pair of terminal bushings, and secured to the interior end of said one terminal bushing of each pair of terminal bushings, a serially connected disconnecting switch structure associated with each interrupting assembly, a pneumatic control unit associated with each interrupting assembly, the interrupting assemblies including piston actuated separable arcing contacts with the exhaust gas blasting through the respective hollow conductor stud, each disconnecting switch structure including an operating cylinder and an operating piston secured to a generally rod-shaped movable disconnecting contact, the operating piston being movable within said operating cylinder, the opening side of the operating piston of each disconnecting switch structure within the operating cylinder being constantly at a relatively low pressure, said rod-shaped movable disconnecting contact having an end portion subject to the pressure within said pressurized enclosure for moving it in the opening direction, and means including a three-way isolator control valve communicating to tank pressure and having a pilot line to the respective pneumatic control unit for alternating the pressure on the closing side of the operating piston from tank pressure to said relatively low pressure for effecting the respective closing and opening movements of the movable disconnecting contact.

9. A compressed-gas circuit interrupter including a pressurized housing, an interrupting assembly including a serially connected disconnecting switch structure, pneumatic control unit and three-way isolator control valve, the interrupting assembly including one or more piston-actuated movable arcing contacts separable to establish arcing, means for utilizing tank pressure to extinguish said arcing, said pneumatic control unit including a driver piston, interrupter pilot piston and isolator pilot piston, the interrupter pilot piston and the isolator pilot piston being attached together to constitute a unit, the disconnecting switch structure including an isolator piston secured to a rod-shaped movable isolator contact and movable within an operating cylinder, means constantly connecting the opening side of the isolator piston with relatively low pressure, said rod-shaped movable isolator contact having an end portion subject to the pressure wihin said pressurized housing for moving it in the opening direction, means including said three-way isolator control valve for alternating the closing side of the isolator piston to tank pressure or said relatively low pressure, a pilot line connection from said isolator control valve to said pneumatic control unit, an exhaust valve and an interrupter valve assembly, a control pipe connection from said last-mentioned valve assembly to said control unit, and a dump pipe interconnecting the control unit with one of said piston actuated arcing contacts.

10. The combination of claim 9, wherein an interrupter control piston is associated with said exhaust valve and interrupter valve assembly and a pilot connection interconnects the interrupter pilot piston of the control unit with one side of said interrupter control piston.

11. In combination, a compressed-gas three-phase circuit interrupter including a grounded metallic pressurized tank, a plurality of pairs of terminal bushings extending within said pressurized tank, at least one terminal bushing of each pair of terminal bushings having a hollow conductor stud for the exhaust of gas, an interrupting assembly secured to the interior end of said one terminal bushing of each pair of terminal bushings, a disconnecting switch structure serially connected with each interrupting assembly, a pneumatic control unit associated with each interrupting assembly and having a three-way isolator control valve associated therewith, each interrupting assembly including one or more piston actuated movable arcing contacts separable to establish arcing, means for utilizing tank pressure to extinguish said arcing and to effect exhausting of the blast gases out through the hollow conductor studs, each pneumatic control unit including a driver piston, interrupter pilot piston and isolator pilot piston, the interrupter pilot piston and the isolator pilot piston of each control unit being attached together to constitute a unit, each disconnecting switch structure including an isolator piston secured to a rod-shaped movable isolator contact and movable within an operating cylinder, means constantly connecting the opening side of the isolator piston with relatively low pressure, said rod-shaped movable isolator contact having an end portion subject to the pressure within said pressurized tank for moving it in the opening direction, means including said three-way isolator control valve for alternating the closing side of each isolator piston to tank pressure or said relatively low pressure, a pilot line connection from each isolator control valve to the respective pneumatic control unit, at least one exhaust valve and interrupter valve assembly associated with the wall of the grounded metallic pressurized tank, a control pipe connection from said last-mentioned valve assembly to one or more pneumatic control units, and a dump pipe connection interconnecting the control unit of each interrupting assembly with one of the piston actuated arcing contacts of the interrupting assembly.

12. The combination of claim 11, wherein an interrupter control piston is associated with the exhaust valve and interrupter valve assembly, and a pilot connection interconnects the interrupter pilot piston of the control unit with one side of said interrupter control piston.

13. A compressed-gas circuit interrupter including a pressurized enclosure having an orifice-shaped relatively stationary contact disposed in a side wall thereof, a cooperable movable arcing contact having one or more apertures through the contact head portion thereof, an operating piston having a movable blast-valve portion and a lost-motion mechanical connection with said movable arcing contact, a blast valve seat surrounding said orifice-shaped relatively stationary contact and cooperating with said movable blast-valve portion, means exhausting the pressure behind said operating piston to open the blast valve, high-pressure gas passing through said one or more apertures to a cavity behind the contact head position of the movable arcing contact, whereby pressure built up within said cavity will retain the movable arcing contact in firm pressure engagement with the relatively stationary orifice-shaped contact until it is forceably picked up by the take-up of said lost-motion connection.

References Cited by the Examiner

UNITED STATES PATENTS

| | | | |
|---|---|---|---|
| 2,459,600 | 1/49 | Strom | 200—148 |
| 2,905,793 | 9/59 | Caswell et al. | 200—148 |
| 2,977,446 | 3/61 | Baker | 200—148 |
| 3,009,042 | 11/61 | Schrameck et al. | 200—148 |
| 3,075,060 | 1/63 | Strom | 200—148 |

FOREIGN PATENTS

| | | |
|---|---|---|
| 1,003,321 | 2/57 | Germany. |
| 582,599 | 11/46 | Great Britain. |
| 605,163 | 7/48 | Great Britain. |

KATHLEEN H. CLAFFY, *Primary Examiner.*

ROBERT K. SCHAEFER, BERNARD A. GILHEANY, *Examiners.*